United States Patent [19]

Uji

[11] Patent Number: 4,862,230
[45] Date of Patent: Aug. 29, 1989

[54] DOUBLE HETEROSTRUCTURE LIGHT EMITTING DIODE

[75] Inventor: Toshio Uji, Tokyo, Japan

[73] Assignee: NEC Corporation, Tokyo, Japan

[21] Appl. No.: 95,712

[22] Filed: Sep. 14, 1987

[30] Foreign Application Priority Data

Sep. 12, 1986 [JP] Japan .................................. 61-216505

[51] Int. Cl.$^4$ ............................................ H01L 33/00
[52] U.S. Cl. ....................................... 357/17; 357/16; 357/90; 357/55
[58] Field of Search ........................ 357/17, 16, 90, 55

[56] References Cited

U.S. PATENT DOCUMENTS

| | | | |
|---|---|---|---|
| 3,419,742 | 12/1968 | Herzog | 357/90 X |
| 3,703,871 | 11/1972 | Saul | 357/90 X |
| 3,977,016 | 8/1976 | Lebailly | 357/17 |
| 4,183,039 | 1/1980 | Aoki et al. | 357/17 |
| 4,608,694 | 8/1986 | Partin | 357/17 X |
| 4,670,689 | 6/1987 | Suzuki | 357/17 X |

FOREIGN PATENT DOCUMENTS

| | | | |
|---|---|---|---|
| 58-90789 | 5/1983 | Japan | 357/17 X |
| 58-142583 | 8/1983 | Japan | 357/17 X |

OTHER PUBLICATIONS

Suzuki et al., "In GaAsP/InP 1.3-$\mu$m Wavelength Surface-Emitting LED's for High-Speed Short-Haul Optical Communication System", *Journal of Lightwave Technology*, vol. LT-3, No. 6, Dec. 1985, pp. 1217–1222.

Primary Examiner—William A. Mintel
Attorney, Agent, or Firm—Sughrue, Mion, Zinn, Macpeak & Seas

[57] ABSTRACT

A double heterostructure light emitting diode comprises a p-active layer, and n and p-cladding layers respectively provided on the both sides of the p-active layer. The p-active layer is doped with p-impurity such that the concentration thereof is distributed therein to be higher in a region proximate to the p-n junction between said p-active and n-cladding layers. As a result, a response time is shortened and light output is increased.

5 Claims, 2 Drawing Sheets

DOUBLE HETEROSTRUCTURE LIGHT EMITTING DIODE

FIELD OF THE INVENTION

The invention relates to a double heterostructure light emitting diode, and more particularly to a double heterostructure light emitting diode which is used for a light source in an optical communication system and so on.

BACKGROUND OF THE INVENTION

A conventional double heterostructure light emitting diode is described on pages 1217 to 1222 of "Journal of Lightwave Technology, Vol. LT-3 No.6" published in December of 1985. The double heterostructure light emitting diode comprises a buffer layer of Sn doped n-InP, an active layer of Zn doped p+-InGaAsP, a cladding layer of Zn doped p-InP, a confining layer of Sn doped n-InGaAsP, a clapping layer of Zn doped p-InGaAsP, and a $SiO_2$ film respectively in turn provided on an n-InP substrate. The double heterostructure light emitting diode further comprises a p-electrode provided on the $SiO_2$ film, an n-electrode having a light emitting window provided on the back surface of the n-InP substrate, and a Zn diffused region of a predetermined diameter built in the confining layer wherein the p-electrode is partly projected into a current injecting aperture of the $SiO_2$ film to be in contact with the Zn-diffused region extending through the capping layer over the confining layer.

According to the double heterostructure light emitting diode described above, the active layer is heavily doped with a p-impurity like Zn to shorten the lift time of carriers to that a high speed response is obtained. As a consequence, the rise and fall times of the light output may be as fast as 350 ps using a specified speedup circuit and applying DC bias offset.

In the conventional double heterostructure light emitting diode, however, the light output is considerably decreased because the active layer is heavily doped with a p-impurity such as Zn etc., although the response time is increased with the increase of the impurity concentration therin. Further, the crystal surface of the active layer tends to be rough due to the high concentration doping so that fabrication yield is decreased. For this reason, there a limitation in obtaining a high speed response in a light emitting diode comprising an active layer to be doped with such a p-impurity as Zn etc.

Alternatively, if an active layer is not heavily doped with a p-impurity a peaking of pulses must be performed in a rise and fall thereof in a circuit for driving the light emitting diode, or a DC bias voltage must be applied thereto to obtain a high speed response.

SUMMARY OF THE INVENTION

Accordingly, it is an object of the present invention to provide a double heterostructure light emitting diode in which high speed response is obtained without deteriorating the light output characteristic.

It is a further object of the present invention to provide a double heterostructure light emitting diode in which high speed response is obtained without decreasing the fabricating yield thereof.

It is a still further object of the invention to provide a double heterostructure light emitting diode in which the high speed response is obtained without relying upon specified controls in a circuit for driving the light emitting diode.

According to the invention, a double heterostructure light emitting diode has a double heterostructure provided on a semiconductor substrate including a p-active layer, and n- and p-cladding layers respecitvely provided on the both sides of said p-active layer. A predetermined level of voltage is applied across the n- and p-cladding layers. The p-active layer is doped with a p-impurity such that the impurity concentration is distributed therein such that it is higher in a region proximate to the p-n junction between said p-active and n-cladding layers.

BRIEF DESCRIPTION OF THE DRAWINGS

The invention will be explained in more detail in accordance with following drawings wherein.

DESCRIPTION OF THE PREFERRED EMBODIMENT

Figure 1:
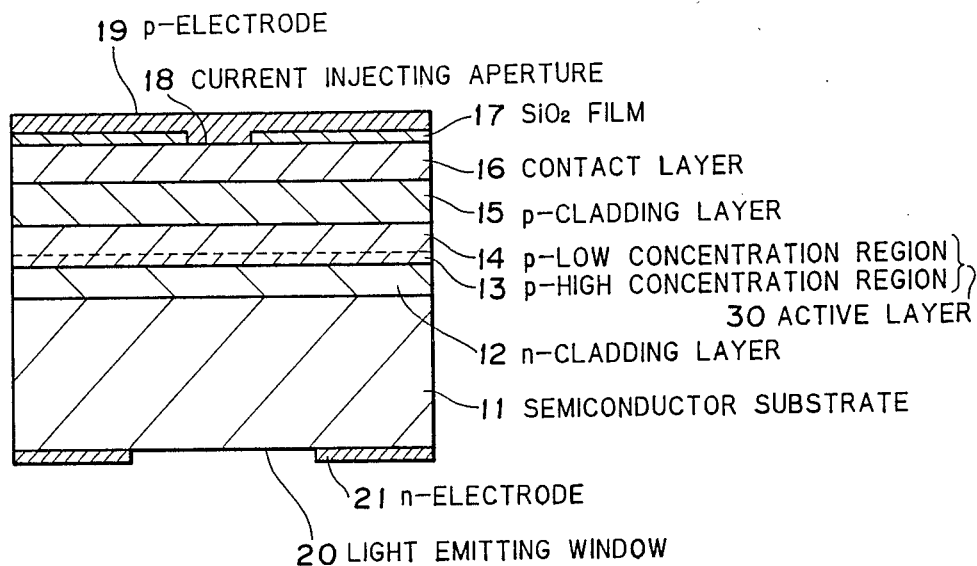
FIG. 1 is a cross sectional view illustrating a double heterostructure light emitting diode in the first embodiment according to the invention.

In FIG. 1, there is shown a double heterostructure light emitting diode according to the first embodiment to the invention. In fabricating the double heterostructure light emitting diode, an n-cladding layer 12 of n-InP, a p-high concentration region 13 of p-InGaAsP which is doped with Zn by $1 \times 10^{19}$ cm$^{-3}$ in its concentration to be of 0.1 $\mu$m in its thickness, a p-low concentration region 14 of p-InGaAsP which is doped with Zn by $7 \times 10^{18}$cm$^{-3}$ in its concentration to be of 0.4 $\mu$m in its thickness, a p-cladding layer 15 of InP, and a contact layer 16 of p-InGaAsP are sequentially provided on a semiconductor substrate 11 on n-InP. In the structure described above, an active layer 30 is composed of the p-high and low concentration regions 13 and 14.

Next, a $SiO_2$ film 17 provided on the contact layer 16, and a current injecting aperture 18 is then formed to be of 20 $\mu$m in its diameter in accordance with the preferential etching of the $SiO_2$ film covered with a photoresist. Thereafter, a p-electrode 19 of TiPt film is provided on the $SiO_2$ film 17 and in the current injecting aperture 18.

Then, an n-electrode 21 of AuGe film is provided so as to have a light emitting window 20 on the back surface of the semiconductor substrate 11 which is polished to be of approximately 100 $\mu$m in its thickness.

In the double heterostructure light emitting diode thus fabricated, the p-high concentration region 13 is provided in the active layer 30 to be in contact with a p-n junction so that a higher speed of electron-hole recombination is obtained in the p-high concentration region 13. This means that electrons are rapidly recombined with holes in the active layer 30, when a driving pulse is turned off in a circuit for driving the light emitting diode. As a result, the light output waveform falls sharply so that the fall time thereof is shortened.

As compared to a conventional double heterostructure light emitting diode which does not have the p-high concentration region 13, the light output fall time is shortened by more than 40% in the first embodiment according to the invention, as far as light output is maintained to be the same level. On the other hand, light output is increased in its level as much as approximately 50% in the case where the fall time thereof is maintained to be the same as that in the conventional light emitting diode. As is apparent from these results, a double heterostructure light emitting diode in which high power light output and high speed response are obtained is provided by the invention.

Further, the fabrication yield of double heterostructure light emitting diodes according to the invention is improved for the reason that the roughness on the surface of the p-high concentration region 13 is of no matter because the p-low concentration region 14 is provided directly thereon to provide the active layer 30.

Figure 2:
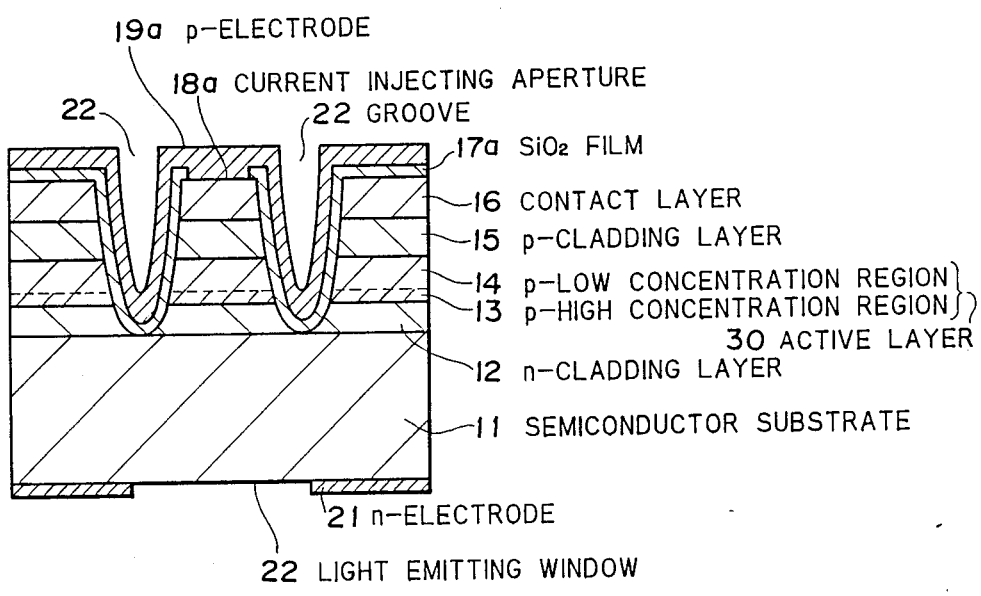
FIG. 2 is a cross sectional view illustrating a double heterostructure light emitting diode in the second embodiment according to the invention.

In FIG. 2, there is shown a double heterostructure light emitting diode according to a second embodiment of the invention wherein like parts are designated by like reference numerals except that a SiO$_2$ film, current injecting aperture and p-electrode are designated respectively by 17a, 18a and 19a so that repeated explanations are omitted here. The double heterostructure light emitting diode is provided with a circular groove 22 which extends through an active layer 30 to confine the current therein, although a p-impurity concentration is distributed in the active layer 30 in the same manner as the first embodiment.

In the double heterostructure light emitting diode according to the second embodiment, parasitic capacitance is much decreased due to the existence of the groove 22 so that the response time is shortened. Further, efficiency in coupling light from the light emitting diode to an optical fiber is greatly improved since the light emitting intensity is distributed uniformly as the current is transversely confined by the groove 22.

As compared to a double heterostructure light emitting diode in the first embodiment, the light output fall time is shortened by as much as a half, while light output level is increased as much as 60% in the second embodiment.

Figure 3A:
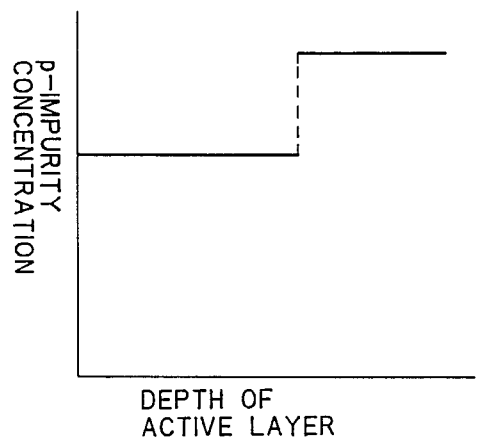
FIGS. 3A and 3B are explanatory diagrams showing p-impurity concentration in an active layer.
Figure 3B:
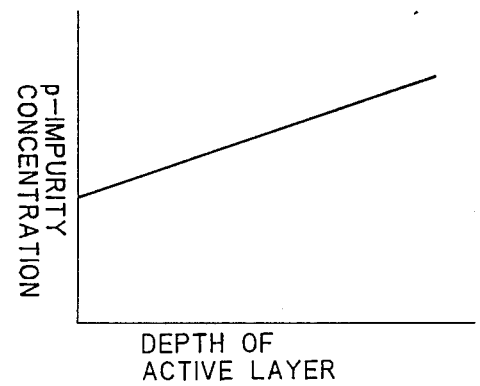

In the first and second embodiments, although a p-impurity concentration is distributed in the active layer 30 to be varied in a step-like manner in a direction of thickness thereof as shown in FIG. 3A, it may be varied gradually in a continuous manner as shown in FIG. 3B with the same effects. Such a distribution of p-impurity concentration is easily carried out by a vapour phase epitaxial growth method.

In operation, carriers injected into the active layer 30 are extinguished in accordance with the recombination thereof during the time when a voltage applied across the p and n-electrodes 19 and 21 becomes zero due to the turning of of a driving pulse applied thereacross. The light output is determined by the extinction of electrons in the active layer 30 because the active layer 30 is doped with p-impurity. At this moment, electrons are collected along the p-n junction in the active layer 30, that is, on the side of the n-cladding layer 12 due to the space charge of the p-n junction. In the light emitting diode according to the invention a much faster extinction time during which electrons are recombined with holes is obtained because a p-impurity concentration is distributed to be higher in the region proximate to the p-n junction in the active layer 30; in other words, a p-impurity concentration is higher in the region where electrons are collected. As a result, light output fall time is extremely shortened.

On the other hand, an improvement is obtained in regard to light output when a driving pulse is turned on, that is, high current injection is performed. At the time of high current injection, carriers are distributed throughout the active layer 30. In the light emitting diode according to the invention, higher light output is produced in spite of the fact that light emitting efficiency is generally deteriorated in accordance with the increase of p-impurity concentration for the reason that a p-impurity concentration is not so high throughout the active layer 30 but rather the p-impurity concentration is high through only a portion of the region.

As described above, higher light output is produced at the time of pulse-on, while light out fall time is remarkably shortened at the time of pulse-off because a p-impurity concentration is distributed in the active layer 30 such that only a portion of the active layer has a high p-impurity concentration.

Although the invention has been described with respect to specific embodiments for complete and clear disclosure, the appended claims are not to be thus limited but are to be construed as embodying all modification and alternative constructions that may occur to one skilled in the art which fairly fall within the basic teaching herein set forth.

What is claimed is:

1. A double heterostructure semiconductor light emitting diode comprising,
    a double heterostructure provided on a semiconductor substrate including a p-active layer, and n and p-cladding layers respectively provided on the both sides of said p-active layer, and
    means for applying a predetermined level of voltage across said n and p-cladding layers,
    wherein said p-active layer is doped with a p-impurity such that the concentration thereof is distributed therein to be higher in a region proximate to the p-n junction between said p-active and n-cladding layers than in the region of said p-active layer proximate the p-p junction between said p-cladding layer and said p-active layer, whereby said region proximate to the p-p junction provides a high speed electron-hole recombination, and said region of said p-active layer proximate to said p-p junction decreases the p-impurity concentration in the light emitting and recombination region of said active layer to maintain a high light output.

2. A double heterostructure light emitting diode according to claim 1,
    wherein said active layer is composed of a first region with a high concentration of a p-impurity and a second region with a low concentration of p-impurity relative to said first region.

3. A double heterostructure light emitting diode according to claim 1,
    wherein said active layer is varied in its p-impurity concentration from the p-n junction between said p-active and n-cladding layers to the p-p junction between the p-active and p-cladding layers in a continuous manner.

4. A double heterostructure semiconductor light emitting diode comprising,
    a semiconductor substrate of n-InP,
    a cladding layer of n-InP adjacent said semiconductor substrate.
    a first layer of p-InGaAsP having a first concentration of p-impurity and adjacent said n-cladding layer,
    a second layer of p-InGaAsP having a second concentration of p-impurity and adjacent said first layer, said first concentration being higher than said second concentration of p-impurity, a cladding layer of p-Inp adjacent said second layer, a contact layer of p-InGaAsP adjacent said p-cladding layer, and a SiO$_2$ film adjacent said contact layer and having a current injecting aperture, a p-electrode provided on said SiO$_2$ film and in said current injecting aperture thereof, and an n-electrode having a light emitting window provided on the back surface of said semiconductor substrate, wherein an active layer is composed of said first and second layers of p-InGaAsP.

5. A double heterostructure light emitting diode according to claim 4 further comprising, a circular groove being extended through said active layer, wherein said SiO$_2$ film and p-electrode are also provided on the surface of said cirular groove.

* * * * *